(12) United States Patent
Cohen

(10) Patent No.: US 7,689,889 B2
(45) Date of Patent: Mar. 30, 2010

(54) CONTENT ADDRESSABLE MEMORY ENTRY CODING FOR ERROR DETECTION AND CORRECTION

(75) Inventor: Earl T. Cohen, Oakland, CA (US)

(73) Assignee: Cisco Technology, Inc., San Jose, CA (US)

( * ) Notice: Subject to any disclaimer, the term of this patent is extended or adjusted under 35 U.S.C. 154(b) by 793 days.

(21) Appl. No.: 11/467,097

(22) Filed: Aug. 24, 2006

(65) Prior Publication Data
US 2008/0049522 A1 Feb. 28, 2008

(51) Int. Cl.
H03M 13/00 (2006.01)

(52) U.S. Cl. ..................................... 714/759

(58) Field of Classification Search ......... 714/763–764, 714/768
See application file for complete search history.

(56) References Cited

U.S. PATENT DOCUMENTS

| | | | |
|---|---|---|---|
| 3,648,254 A | 3/1972 | Beausoleil |
| 4,168,486 A | 9/1979 | Legory |
| 4,296,475 A | 10/1981 | Nederlof et al. |
| 4,692,922 A | 9/1987 | Kiriu et al. |
| 4,740,968 A | 4/1988 | Aichelmann, Jr. |
| 4,791,606 A | 12/1988 | Threewitt et al. |
| 4,852,100 A | 7/1989 | Christensen et al. |
| 4,996,666 A | 2/1991 | Duluk, Jr. |
| 5,313,475 A | 5/1994 | Cromer et al. |
| 5,379,304 A | 1/1995 | Dell et al. |
| 5,383,146 A | 1/1995 | Threewitt |
| 5,440,715 A | 8/1995 | Wyland |
| 5,450,351 A | 9/1995 | Heddes |
| 5,841,874 A | 11/1998 | Kempke et al. |
| 5,842,040 A | 11/1998 | Hughes et al. |
| 5,845,324 A | 12/1998 | White et al. |
| 5,852,569 A * | 12/1998 | Srinivasan et al. ....... 365/49.15 |
| 5,978,885 A | 11/1999 | Clark, III |
| 6,041,389 A | 3/2000 | Rao |
| 6,047,369 A | 4/2000 | Colwell et al. |
| 6,069,573 A | 5/2000 | Clark, II et al. |
| 6,181,698 B1 | 1/2001 | Hariguchi |

(Continued)

OTHER PUBLICATIONS

Mcauley et al., "Fast Table Lookup Using CAMs," Networking: Foundation for the Future, IEEE, vol. 3, pp. 1382-1391, Mar. 28-Apr. 1, 1993.

(Continued)

*Primary Examiner*—Shelly A Chase
(74) *Attorney, Agent, or Firm*—Stolowitz Ford Cowger LLP

(57) ABSTRACT

A Content Addressable Memory (CAM) or Ternary CAM (TCAM) provides error detection and correction (EDAC). EDAC codes are chosen based on logical and physical properties of the CAM/TCAM. An entry in the CAM/TCAM comprises a plurality of groups, each group comprising a plurality of storage bits. Writes to the storage bits are encoded to enable EDAC. Lookup data is divided into lookup groups of one or more bits, and is applied to corresponding groups of entries to be searched. In one embodiment, storage bits in a group are first decoded to detect and/or to correct errors and then compared with a lookup group to produce a hit indication. In another embodiment, storage bits in a group are logically combined with a lookup group to produce a hit indication, wherein a correctable error in the storage bits does not affect correctness of the hit indication.

28 Claims, 9 Drawing Sheets

U.S. PATENT DOCUMENTS

| | | | |
|---|---|---|---|
| 6,295,576 B1 | 9/2001 | Ogura et al. | |
| 6,307,798 B1 | 10/2001 | Ahmed et al. | |
| 6,307,855 B1 | 10/2001 | Hariguchi | |
| 6,362,991 B1 | 3/2002 | Barnes | |
| 6,374,326 B1 | 4/2002 | Kansal et al. | |
| 6,377,577 B1 | 4/2002 | Bechtolsheim et al. | |
| 6,385,071 B1 | 5/2002 | Chai et al. | |
| 6,389,506 B1 | 5/2002 | Ross et al. | |
| 6,467,019 B1 | 10/2002 | Washburn | |
| 6,477,071 B1 * | 11/2002 | Edman et al. | 365/49.15 |
| 6,510,509 B1 | 1/2003 | Chopra et al. | |
| 6,526,474 B1 | 2/2003 | Ross | |
| 6,535,951 B1 | 3/2003 | Ross | |
| 6,597,595 B1 | 7/2003 | Ichiriu et al. | |
| 6,606,681 B1 | 8/2003 | Uzun | |
| 6,618,281 B1 | 9/2003 | Gordon | |
| 6,643,260 B1 | 11/2003 | Kloth et al. | |
| 6,651,096 B1 | 11/2003 | Gai et al. | |
| 6,658,002 B1 | 12/2003 | Ross et al. | |
| 6,658,458 B1 | 12/2003 | Gai et al. | |
| 6,678,786 B2 | 1/2004 | Srinivasan et al. | |
| 6,687,144 B2 | 2/2004 | Batson et al. | |
| 6,715,029 B1 | 3/2004 | Trainin et al. | |
| 6,717,946 B1 | 4/2004 | Hariguchi et al. | |
| 6,725,326 B1 | 4/2004 | Patra et al. | |
| 6,728,124 B1 | 4/2004 | Ichriu et al. | |
| 6,732,227 B1 | 5/2004 | Baumann | |
| 6,738,862 B1 | 5/2004 | Ross et al. | |
| 6,775,737 B1 | 8/2004 | Warkhede et al. | |
| 6,792,502 B1 * | 9/2004 | Pandya et al. | 711/108 |
| 6,862,281 B1 | 3/2005 | Chandrasekaran | |
| 6,871,262 B1 | 3/2005 | Oren et al. | |
| 6,871,265 B1 | 3/2005 | Oren et al. | |
| 6,879,504 B1 | 4/2005 | Lien | |
| 6,961,808 B1 | 11/2005 | Oren et al. | |
| 6,970,971 B1 | 11/2005 | Warkhede et al. | |
| 6,988,106 B2 | 1/2006 | Enderwick et al. | |
| 6,996,662 B2 | 2/2006 | Miller et al. | |
| 7,054,995 B2 * | 5/2006 | Chow et al. | 711/108 |
| 7,065,609 B2 | 6/2006 | Eatherton et al. | |
| 7,080,195 B2 | 7/2006 | Ngai et al. | |
| 7,082,492 B2 | 7/2006 | Pullela et al. | |
| 7,100,097 B2 | 8/2006 | Patella et al. | |
| 7,103,708 B2 | 9/2006 | Eatherton et al. | |
| 7,177,978 B2 | 2/2007 | Kanekar et al. | |
| 7,200,793 B1 * | 4/2007 | Kengeri et al. | 714/768 |
| 7,243,290 B2 | 7/2007 | Slavin | |
| 7,257,672 B2 | 8/2007 | Shoham et al. | |
| 7,257,763 B1 * | 8/2007 | Srinivasan et al. | 714/764 |
| 7,260,673 B1 | 8/2007 | Ross | |
| 7,260,674 B2 * | 8/2007 | Mukherjee | 711/108 |
| 7,266,004 B2 | 9/2007 | Krishnan | |
| 7,290,083 B2 | 10/2007 | Shoham et al. | |
| 7,305,519 B1 | 12/2007 | Nagaraj | |
| 7,336,660 B2 | 2/2008 | Pullela | |
| 7,345,897 B2 | 3/2008 | Krishnan et al. | |
| 7,349,230 B2 | 3/2008 | Parthasarathy et al. | |
| 7,349,415 B2 | 3/2008 | Rangaranjan et al. | |
| 7,350,131 B2 | 3/2008 | Trainin | |
| 7,356,033 B2 | 4/2008 | Basu et al. | |
| 2004/0015753 A1 | 1/2004 | Patella et al. | |
| 2004/0172346 A1 | 9/2004 | Kanekar et al. | |

OTHER PUBLICATIONS

Stolowitz Ford Cowger, Listing of Related Cases, Sep. 21, 2009.

* cited by examiner

US 7,689,889 B2

CONTENT ADDRESSABLE MEMORY ENTRY CODING FOR ERROR DETECTION AND CORRECTION

BACKGROUND

Field

One embodiment of the invention relates to content addressable memories.

Unless explicitly so stated, concepts, descriptions, techniques, and definitions contained herein should not be construed as being an admission that such concepts, descriptions, techniques, and definitions are either publicly known or are otherwise part of the prior art.

A Random Access Memory (RAM) when given an index returns a value at a location specified by the index. A Content Addressable Memory (CAM) performs search operations. Given a value, a CAM returns an index of a location containing the value, along with other information such as a hit indication. A Ternary Content Addressable Memory (TCAM) performs a search similar to that of a CAM, but a TCAM allows stored values to have bit positions that are "don't cares". Hence the "ternary" designation, since a "bit" in a value stored in a TCAM can have one of three states: a 0, a 1, or a "don't care". Since digital logic used to implement CAMs and TCAMs is primarily binary and only offers two states (0 and 1), in various embodiments values stored in TCAMs use a two-bit binary encoding so that each bit position in the values can have one of three possible states.

TCAMs have many uses, such as in networking applications where an Internet Protocol (IP) address is looked up to determine, for example, routing information associated with a prefix of the IP address. Some uses of TCAMs require high reliability. A networking application could be very sensitive to misrouting or to dropping packets, as might occur due to errors in a TCAM.

As with other storage devices such as RAMs, CAMs and TCAMs are susceptible to errors in stored state, for example from single-event upsets. Single-event upsets can occur due to particle-induced errors, such as from environmental neutrons or from alpha particles in semiconductor packaging material. Unlike RAMs, however, it is more difficult to use traditional techniques for error detection and correction with CAMs and TCAMs. The ternary nature of TCAMs also makes it difficult to correct errors on the fly, as might be done in a RAM using an Error Detecting and Correcting Code (EDAC). Some implementations of TCAMs have used other techniques for reliability, such as parity applied to the ternary entries, combined with background "scrubbing" of the contents of the TCAM to detect errors. Scrubbing, however, might not detect errors before errored data is used, and hence is not the highest reliability solution. Techniques adapting error correction to TCAMs have either had excessive overhead that greatly increases the number of storage bits required in the TCAM, or have imposed restrictions on the usage of the TCAM by imposing limitations on where in the TCAM values can be stored.

The present invention addresses this and other problems associated with the prior art.

DETAILED DESCRIPTION

Figure 1:
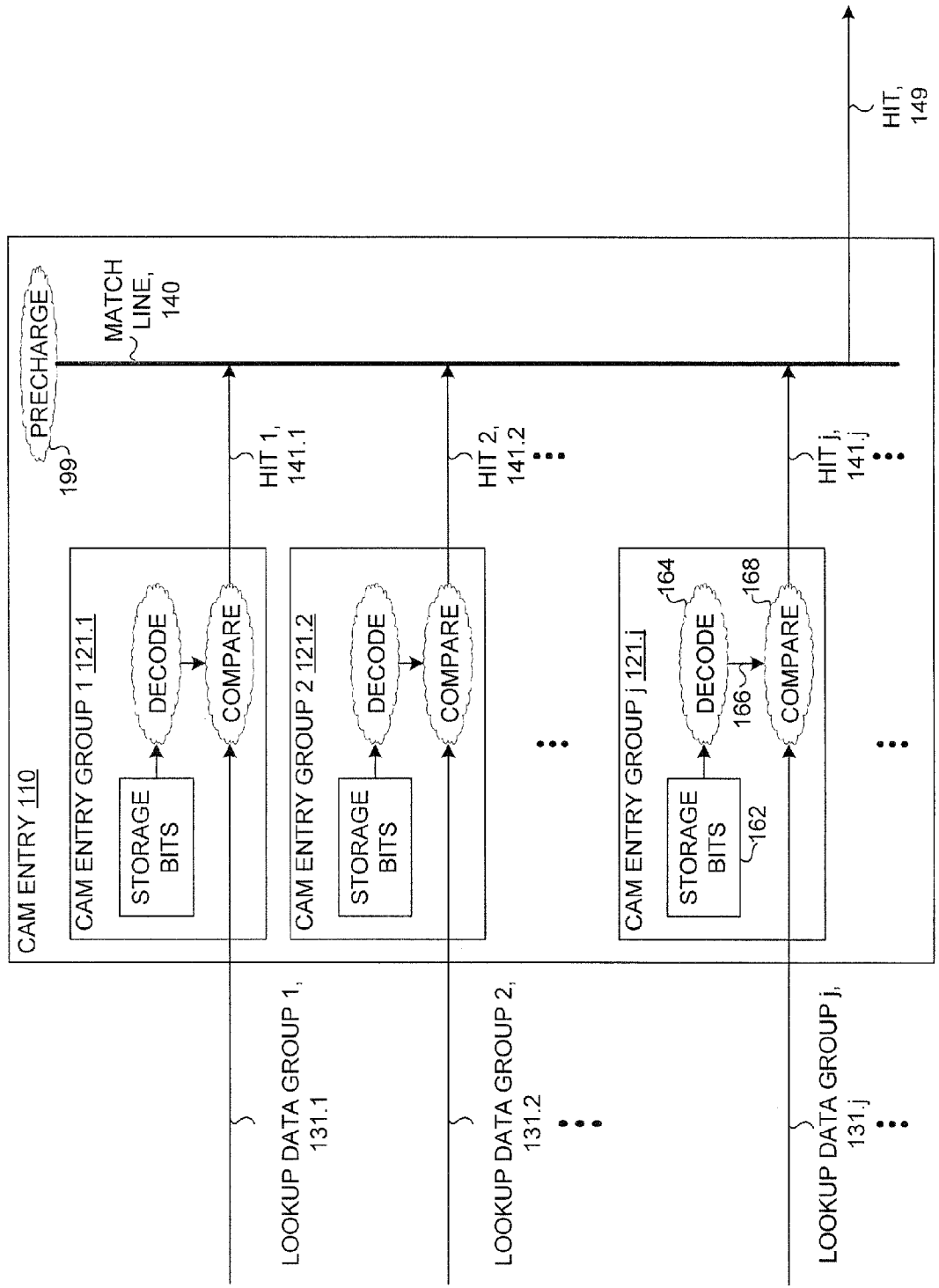
FIG. 1 illustrates a content addressable memory entry with multiple entry groups, the entry groups similar to those shown in FIG. 4.

The invention may be implemented in a variety of ways, such as by a process, an apparatus, as all or part of a system, and as a computer readable medium. The invention encompasses numerous embodiments, a number of which are described herein. The features and advantages of the invention will become more readily apparent from the following detailed description of various embodiments of the invention which proceeds with reference to the accompanying drawings. As is well established, due to practicality the embodiments used for illustration herein can not be an exhaustive list of all possible embodiments, but rather are chosen to show specific features and techniques of the invention. Thus, the invention should not be construed to be limited by the description below, but only by the claims of the issued patent.

Introduction

This introduction is intended only to provide a more complete understanding of the Detailed Description. The invention should not be construed to be limited to the techniques and concepts disclosed in the introduction. There are many embodiments of the invention to which claims will be drawn that are discussed throughout the specification.

In various implementations, CAMs and TCAMs are comprised of a plurality of entries holding values to be searched, input circuitry to receive values to be looked up (searched for) and/or data to be written to entries, control logic to control the operation of the CAM/TCAM, and output circuitry to provide match information and/or data read from the entries. In some implementations, the input circuitry further receives mode bits and/or commands controlling the operation of the CAM/TCAM. For example, in some usage scenarios a mode bit is a static control input selecting an operating mode of the CAM/TCAM, and a command is a dynamic input controlling, at least in part, interpretation of or action upon other inputs. Examples of commands to a CAM/TCAM include initiating a search of the CAM/TCAM, initiating a search of specific portions of the CAM/TCAM, reading or writing one or more entries of the CAM/TCAM, reading or writing internal control/status registers of the CAM/TCAM, or changing an operating mode of the CAM/TCAM. Some commands require data inputs which may be supplied with the command, or by other techniques such as from inputs provided with or as the results of previous commands. A read command generally requires an address or location, such as the index of an entry. A write command generally requires an address or location, and corresponding write data.

In some embodiments, each entry of a CAM/TCAM is associated with an index, the index being a location (or address) of the entry unique among all entries in the CAM/TCAM. In some implementations, entries are organized into banks. In some implementations with separate banks, the index may have a portion specifying a bank, and a portion specifying a location within the bank. In various embodiments with separate banks, a lookup of the CAM/TCAM may operate upon banks selectively, so that a lookup only searches in selected banks. In some implementations, selection of the banks enabled for a particular lookup is a function of control information received by input circuitry along with the lookup data. In some implementations, selection of the banks enabled for a particular lookup is a function of control logic and internal control/status registers of the CAM/TCAM.

In some embodiments, each entry of a CAM or a TCAM reports a hit (or, equivalently, a miss) indication when a stored comparison value of the entry matches lookup data during a search. In some implementations, hit indications among all entries enabled for a search are combined by prioritization logic to produce match information that is output from the CAM/TCAM. In various embodiments, the match information includes summarized hit information (indicating, for example, if a hit was found in any entry), and the index of an entry that hit (if any). In some usage scenarios, the prioritization logic incorporates rules for choosing among multiple entries that each signaled a hit. In various embodiments, control logic controls a manner in which the prioritization logic operates. In some embodiments, prioritization among multiple entries that each signaled a hit is done using a priority encoder. In some implementations, the prioritization is done in parts. For example, there may be a first level of prioritization within a bank, and a second level of prioritization among enabled banks. In various implementations, there is an indication, such as an output or a control/status register, that multiple entries reported a hit. In some usage scenarios, methods are provided to output the indices of multiple entries that hit. Many alternative ways to report the summarized hit information, and to prioritize among multiple entries reporting a hit, are within the scope of the techniques described herein.

In some implementations, write data to a CAM/TCAM is received by the same input circuitry as the lookup data, with control information, such as a command received with the data, determining whether the CAM/TCAM should perform a write or a lookup. In some usage scenarios, if a write is requested, the index of the entry to be written is also received by input circuitry. In some TCAM embodiments, a write can be selected, such as via a command, to modify a mask portion or a data portion of an entry, the mask and data portions together storing the ternary comparison value of the entry. In some TCAM implementations, write data may take other forms, and/or the ternary value may be stored in another fashion than as a mask value and a data value.

In some CAM/TCAM implementations, entries are wider than a width of data received by the input circuitry for write commands, and the entries must be written in multiple pieces. In some CAM/TCAM embodiments, entries may be joined together to effect wider searches than the width of a single entry. For example, a CAM/TCAM may have a default operating mode where lookups are one-entry wide, and a double-width operating mode where two entries are combined, halving the usable number of entries but doubling the width of lookups.

In some embodiments, control logic in a CAM/TCAM is programmable via input circuitry of the CAM/TCAM. In some implementations, commands to the CAM/TCAM can read or write control/status registers in the CAM/TCAM as well as entries of the CAM/TCAM. For example, a write command to the CAM/TCAM can include an indication as to whether the write is to an entry or to a control/status register; an address received as an input along with the command is either an entry index, or a control/status register address, depending on the type of write indicated. Modifications of control/status registers can be used to perform operations such as enabling or disabling banks, changing operating modes of the CAM/TCAM, or changing whether error detection and/or correction is enabled. In some usage scenarios, inputs of the CAM/TCAM, acting as mode bits, are used in conjunction with control/status registers to define a current operating mode of the CAM/TCAM.

In some embodiments, control/status registers are readable via output circuitry of a CAM/TCAM. For example, a command to the CAM/TCAM received via input circuitry could be a read command, and could include an indication of either a read of an entry (or a portion thereof) or a read of a control/status register. In some implementations, reading of control/status registers is used for operations such as providing status, reporting entry indices or bank indices when multiple entries signaled a hit on a lookup, or detailed error reporting. In some usage scenarios, detailed error reporting includes a location and type of errors reported by error detection and correction logic.

In some embodiments, reading of entries in a CAM/TCAM is used to provide scrubbing to detect entries that have errors, such as uncorrectable errors due to one or more single-event upsets. In some implementations, entries are read and compared external to the CAM/TCAM with known good values to see if the entries have been corrupted. In some implementations, reading an entry performs error detection and optionally correction on the entry, and an error in the entry is reported via reading a control/status register, or by an output such as an interrupt output. In various embodiments, reading an entry that has a correctable error returns corrected data, and the presence of an error is reported in a control/status register, and optionally, if enabled, via an error output such as an interrupt output.

Error Detection and Correction

CAMs and TCAMs, similar to RAMs, are susceptible to errors in stored state, such as due to single-event upsets. Some high reliability systems include error detection and/or correction on direct-access storage structures such as RAMs in order to increase reliability by being able to detect and/or to gracefully handle single-event upsets or other errors in stored state. Including error detection and/or correction on associative storage structures, such as CAMs and TCAMs, is not as straight-forward as doing so with RAMs because values stored in the associative data structure are needed in order to correctly search the structure. Hence, any error in the associative storage structure, if not detected and/or gracefully handled, may decrease reliability by causing incorrect search results.

In some embodiments, a CAM or TCAM is enabled for higher reliability operation by including error detection and correction capability to protect entries in the CAM/TCAM from errors in stored state, such as due to single-event upsets.

In various embodiments, the error detection and correction is done on-the-fly so that searches of the CAM/TCAM return the correct answer, provided that any errors are within a correctable limit. In some embodiments, the error detection and correction is also used, at least in some operating modes, to correct errors when reading entries from the CAM/TCAM, such as for diagnostic purposes or for scrubbing. In some implementations, errors detected during searching and/or reading are reported on an error-reporting output, such as an interrupt output, of the CAM/TCAM. In some implementations, errors detected during searching and/or reading are reported via a control/status register that can be later accessed by a read operation. In various usage scenarios, control logic operating via control/status registers defines operating modes determining behavior such as when error detection and/or correction is enabled, whether errors are reported, and how errors are reported.

In some embodiments, entries of a CAM or TCAM are enabled for higher reliability operation by including error detection and correction capability to protect the entries from errors in stored state of the entry. In some implementations, a comparison value stored in an entry is protected with an error detection and correction code by storing the comparison value in an encoded form. In various embodiments, each entry includes logic to perform error detection and/or correction of a stored comparison value. In some implementations, a stored comparison value in an entry is first decoded, correcting any errors within a correctable limit, to produce a corrected comparison value, and then the corrected comparison value is used in a lookup operation. In some implementations, a comparison value in an entry is stored in an encoded form, and lookups operate directly upon the encoded form and upon lookup data; due to the encoding and to special logic used in lookup comparisons, errors in the comparison value within a correctable limit do not affect the correctness of the lookup comparison, performing, in essence, an error-correcting comparison.

In some embodiments, a comparison value stored in an entry of a CAM or a TCAM is encoded with an error detection and correction code in order to provide tolerance for single-event upsets or other errors affecting stored state holding the comparison value. In various TCAM implementations, the error detection and correction code is specifically designed for TCAMs. In some CAM and TCAM implementations, the error detection and correction code is chosen according to guidelines provided in the section "Choice of Codes" below. In some usage scenarios, the error detection and correction code is designed to correct a certain threshold of errors, such as up to a correctable limit, and a number of errors exceeding the threshold may be detected, or may cause improper results. In some usage scenarios, the error detection and correction code is designed to correct up to a first threshold of errors, and to detect up to a second threshold errors; a number of errors exceeding the second threshold may be detected, or may cause improper results.

In some embodiments, write data to a CAM or TCAM received via input circuitry is encoded by an error detection and correction code encoder before the write data is selectively provided to entries, or to portions thereof, for storage therein. In some implementations, there is one encoder per bank of the CAM/TCAM. In some implementations, there are multiple encoders, each associated with one or more banks. In various embodiments, different banks of the CAM/TCAM use different encoders, and thus can implement different EDAC codes. For example, some banks in the CAM/TCAM may be designed with only a low-level of reliability, using an EDAC code with lower cost, while other banks are designed with a high degree of reliability using a "stronger" EDAC code with a larger cost.

In some TCAM implementations, write data is provided as two separate writes to each entry, one write for a mask value and one for a data value (or some other equivalent two-bit representation of a ternary value). In some TCAM usage scenarios, a first write to an entry, or to a portion thereof, of either a mask value or of a data value is saved in a holding area pending a subsequent second write of the other type of value; upon the subsequent second write of the other type of value, the mask value and data value both being available (one in the holding area, the other from input circuitry), the encoder encodes the mask value and the data value jointly, and an encoded result is provided to one or more entries being written.

In some embodiments, each entry of a CAM or TCAM is segregated into a plurality of entry groups, each entry group comprising a number of storage bits. The storage bits among all entry groups of an entry hold the value stored in the entry, each entry group holding a respective portion of the value. In various embodiments, the storage bits of an entry group hold the respective portion of the value in an encoded fashion, the encoding chosen to enable error detection and correction of the storage bits. In some implementations, the encoding is chosen using guidelines in the section "Choice of Codes" below. In some TCAM implementations, the encoding is optimized to take advantage of the ternary nature of TCAMs. In some CAM or TCAM implementations, the encoding is optimized for ease of decoding in the particular technology used to fabricate the CAM/TCAM.

In some embodiments, each entry of a CAM or TCAM is segregated into a plurality of entry groups, each entry group comprising a number of storage bits, the storage bits holding an encoded portion of a compare value stored in the entry. In some implementations, lookup data is searched for among all enabled entries by applying a corresponding portion of the lookup data to a respective entry group of each entry enabled for searching. For example, in some implementations, each entry group corresponds to two bit positions of the comparison value, and thus contains storage bits to hold a two-bit portion of the comparison value. For a CAM, storing a two-bit portion of the comparison value requires two storage bits; for a TCAM, storing a two-bit portion of the comparison value requires four storage bits. Additional storage bits are required for the encoded version of the two-bit portion of the comparison value, depending on the correctable limit of the error detection and correction code used to encode the storage bits. Generally, a higher correctable limit requires more additional storage bits. Continuing the example, if the CAM/TCAM implemented a 64-bit search, 32, two-bit entry groups would be required per entry. A first entry group would correspond to bit positions 0 and 1, a second entry group to bit positions 2 and 3, and so on until a $32^{nd}$ entry group would correspond to bit positions 62 and 63. The lookup data applied to the CAM/TCAM would be similarly and correspondingly segregated, with bits 0 and 1 of the lookup data coupled to the first entry group of each entry, bits 2 and 3 of the lookup data coupled to the second entry group of each entry, and so on, ending with bits 62 and 63 of the lookup data coupled to the $32^{nd}$ entry group of each entry. (The ordering and/or numbering of bit positions may be varied within the scope of the techniques described herein.)

In some embodiments, each entry of a CAM or TCAM is segregated into a plurality of entry groups, each entry group corresponding to a number of bit positions of the CAM/TCAM. In some implementations, each entry group corresponds to one bit position of the CAM/TCAM. In some implementations, each entry group corresponds to two or more bit positions of the CAM/TCAM. In some implementations, different entry groups may correspond to different numbers of bit positions of the CAM/TCAM. In various embodiments, lookup data to the CAM/TCAM is segregated correspondingly into lookup groups, each lookup group corresponding to a number of bit positions of the CAM/TCAM, each lookup group coupled to a respective entry group, the entry group corresponding to a same number of bit positions of the CAM/TCAM as the lookup group. In some usage scenarios, each entry holds a comparison value, the comparison value segregated into portions such that each entry group holds a respective portion of the comparison value, the size of the respective portion equal to a corresponding number of bit positions of the CAM/TCAM of the entry group.

In some embodiments, each entry of a CAM or TCAM is segregated into a plurality of entry groups, each entry group of an entry holds a portion of a comparison value stored in the entry, each entry group is coupled to a corresponding portion of lookup data, and each entry group performs a portion of the comparison between the comparison value and the lookup data, generating a portion compare result. Portion compare results among all entry groups of an entry are combined to produce a full result, such as a hit (or miss) indication, for the entry as a whole. In some embodiments, portion compare results are combined using a precharged "match" line; the match line is precharged to a "match" state prior to a lookup, and any portion compare results reporting a miscompare discharge the match line, resulting in an overall report of miscompare if even one portion compare result miscompares. In some implementations, an entry group corresponding to multiple bit positions of a CAM/TCAM has multiple connections to a "match" line, one for each bit position of the entry group. In some implementations, an entry group corresponding to multiple bit positions of a CAM/TCAM produces a single portion compare result summarized among the multiple bit positions of the entry group, and has just one connection to a "match" line. Many alternative ways to generate portion compare results, or to accumulate or to combine portion compare results among multiple entry groups of an entry, are within the scope of the techniques described herein.

In some embodiments, each entry of a CAM or TCAM is segregated into a plurality of entry groups, each entry group corresponding to a number of bit positions of the CAM/TCAM; write data to the CAM/TCAM received via input circuitry is similarly segregated into corresponding portions. In some implementations, write data from the input circuitry is sent through an error detection and correction encoder to provide encoded write data for the entries. In various embodiments, the encoding operates independently on each portion of the write data corresponding to a separate entry group, allowing each entry group to independently perform decoding on the portion of the write data it stores. In some implementations, some portions of the write data are encoded using different error detection and correction codes from other portions, and thus some entry groups can use different error detection and correction logic. For example, a more significant subset of the entry groups could receive write data encoded with a relatively stronger error detection and correction code (and would thus tolerate a correspondingly larger number of errors in the more significant subset of the entry groups), while a less significant subset of the entry groups could receive write data encoded with a relatively weaker error detection and correction code (and would thus tolerate a correspondingly smaller number of errors in the less significant subset of the entry groups).

Choice of Codes

The choice of codes used to provide Error Detection and Correction (EDAC) for the contents of a CAM or TCAM has an impact on cost, in such terms as area and power, as well as on ease of physical implementation. If too many bits of state of the CAM/TCAM are covered by a code, area may increase due to a need for more global wiring, or a need for more complex circuitry required per entry to carry out either decoding or an error-correcting comparison. If too few bits of state of the CAM/TCAM are covered by a code, the overhead of the redundant state needed to implement the code may be excessive. The precise trade-off is implementation dependent, based on factors such as the technology used to implement the CAM/TCAM, timing constraints of the search process, or physical constraints of the CAM/TCAM layout. Some sample codes and techniques for selecting codes that can efficiently implement EDAC for TCAMs are presented below. The techniques for binary CAMs may be simpler because there are no spare states in the value-encoding of a binary CAM, and hence there may be less opportunity to find a more optimal encoding. However, other trade-offs related to optimizing the code for ease of logical and physical implementation are relevant for both binary and ternary CAMs.

Because a TCAM requires a three-state encoding ("0", "1", and "don't care"), in various implementations two binary bits are used to encode the three states. For example, the state "0" could be encoded as the two-bit value '00', the state "1" could be encoded as the two-bit value '01', and the state "don't care" could be encoded as the two-bit value '1x' (where 'x' is used to represent a bit that can be either a 0 or a 1).

In various implementations, EDAC is provided by ensuring that all values of interest are encoded in a way that guarantees a "minimum distance" between the encoded values. The "minimum distance" is a minimum number of bits that must be changed to alter the value used for one encoded state into the value used for another encoded state. A minimum distance of three between any pair of encoded state values is necessary to provide single-error correction, and a minimum distance of four between any pair of encoded state values is necessary to provide single-error correction and double-error detection.

Figure 8A:
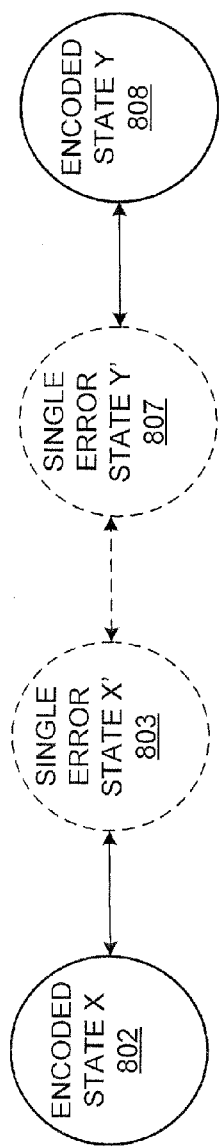
FIG. 8A is an example showing how a distance between two encoded states is used for single-error correction.

FIG. 8A is an example showing how a distance between two encoded states is used for single-error correction. Two desired states, state X 802 and state Y 808, are each encoded by a binary value. For example, state X may be represented by the three-bit value '000', and state Y by the three-bit value '111'. Errors in the encoded binary value can make one encoded value look more like or less like another. A one-bit error in the encoded value for state X 802 results in single error state X' 803, and a one-bit error in the encoded value for state Y 808 results in single error state Y' 807.

Using the example three-bit encoded state values, state X' could be any of the values '001', '010', or '100', and similarly state Y' could be any of the values '110', '101', or '011'. Note that all values associated with single error state X' are distinct from the values associated with single error state Y'; this property is what allows any single-bit error to be uniquely associated with the correct, error-free state. This property was ensured by selecting values for state X and state Y that were a minimum of three bits apart, so that a single-bit error in the encoded value used for one state would still be two bits way from the encoded value used for the other state (and thus not look like a single-bit error in the encoded value used for the other state).

In this example, a two-bit error, is not detectable. For example, a two-bit error in the encoded value for state X 802 could result in a value belonging to single error state Y' 803, which could mistakenly be assumed to be a single-bit error from state Y 808. As a concrete example, a two-bit error in state X (encoded as value '000') could result in '110' which is one of the values belonging to single error state Y'. Hence, with this single-error correcting code, a two-bit error may be miscorrected.

It is also possible from this example to illustrate one technique for constructing error-correcting comparison logic. If state X represented a desired value of '0', and state Y represented a desired value of '1', a comparison between a data input and the encoded (and possibly errored) state would need to report a "hit" whenever the data input was '0', and the encoded state value represented states X or X': any of '000', '001', '010', or '100'. And similarly, the comparison would need to report a "hit" whenever the data input was '1', and the encoded state value represented states Y or Y': any of '111', '110', '101', or '011'. Logic to implement this error-correcting comparison could be designed in a number of ways; one way counts the number of ones in the encoded state value to distinguish states X and X' from states Y and Y':

match=data^(ones_count(encoded_state_value)<2)

Of course, different encodings of the state values will lead to different logic with different implementation costs.

Figure 8B:
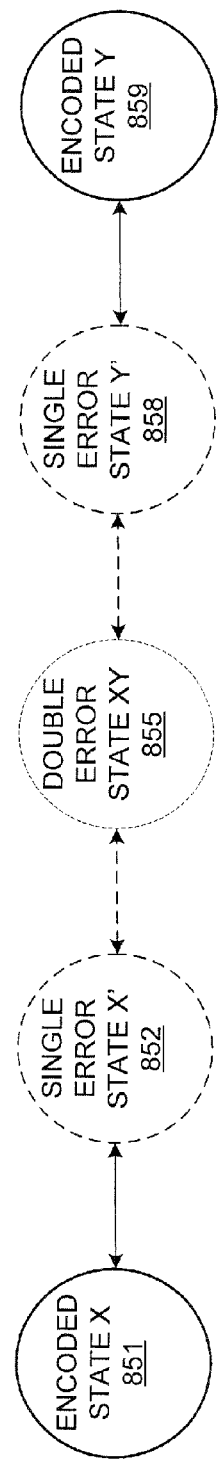
FIG. 8B is an example showing how a distance between two encoded states is used for single-error correction and double-error detection.

FIG. 8B is an example showing how a distance between two encoded states is used for single-error correction and double-error detection. Two desired states, state X 851 and state Y 859, are each encoded by a binary value. For example, state X may be represented by the four-bit value '0000', and state Y by the four-bit value '1111'. A one-bit error in the encoded value for state X 851 results in single error state X' 852, and a one-bit error in the encoded value for state Y 859 results in single error state Y' 858. A two-bit error in the encoded value for state X 851, or equivalently a one-bit error in the encoded value for state X' 852, results in double error state XY 855. Similarly, a two-bit error in the encoded value for state Y 859, or equivalently a one-bit error in the encoded value for state Y' 852, results in double error state XY 855.

Because the double error state XY is unique from the single error states X' and Y', double-bit errors from one state are not confused with single errors from another state and can be detected. Using the example, four-bit encoded state values above, state X' could be any of the values '0001', '0010', '0100', and '1000', state Y' could be any of the values '1110', '1101', '1011', and '0111', and state XY could be any of the values '0011', '0101', '0110', '1001', '1010', and '1100'. Note that the values associated with each of the states are distinct, and thus any single-bit error can be associated with the correct state, and any double-bit error can be identified as not being correctable.

This property was ensured by selecting encoded values for state X and state Y that were a minimum of four bits apart, so that a single-bit error in the encoded value of one state would still be three bits away from the encoded value of the other state (and thus not look like either a single-bit error or a double-bit error in the encoded value of the other state). A triple-bit error, however, would be mistaken for a single-bit error and would be miscorrected.

Figure 9:
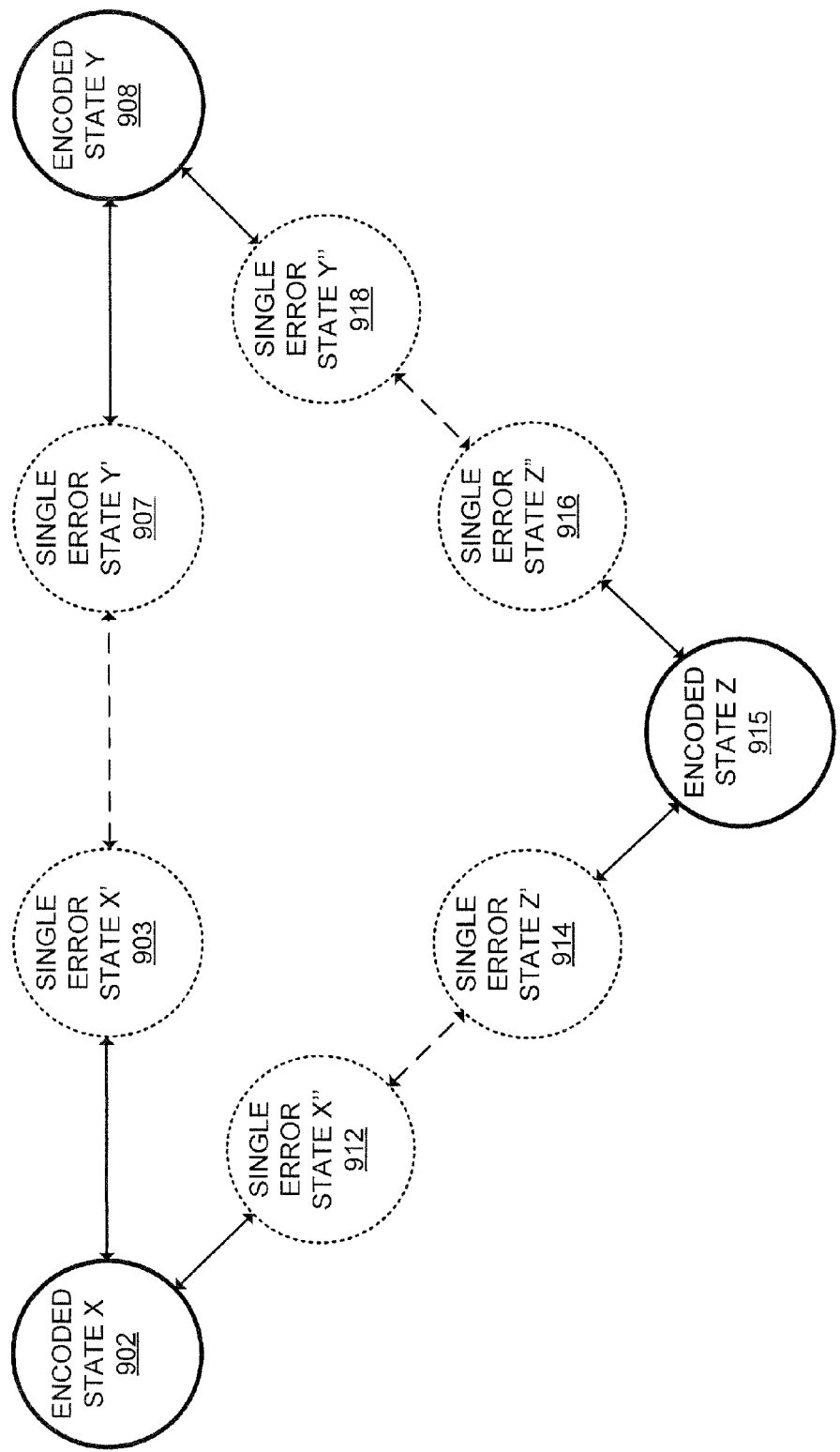
FIG. 9 is an example showing how distances among three encoded states are used for single-error correction.

FIG. 9 is an example showing how distances among three encoded states are used for single-error correction. Three desired states, state X 902, state Y 908, and state Z 915, are each encoded by a binary value. For example, state X may be represented by the five-bit value '00000', state Y by the five-bit value '11100', and state Z by the five-bit value '00111'. Errors in the encoded binary value can make one state look more like or less like another.

A one-bit error in the encoded value for state X 902 results in one of single error state X' 903 or single error state X" 912. A one-bit error in the encoded value for state Y 908 results in one of single error state Y' 907 or single error state Y" 918. A one-bit error in the encoded value for state Z 915 results in one of single error state Z' 914 or single error state Z" 916. Single error states X' and X" (and similarly, single error states Y' and Y", and single error states Z' and Z") may not be distinct, though they are shown that way in the figure for purposes of illustration, in that some binary values for these states may be equally close to the encoded binary values of each of the other un-errored states. Using the five-bit example encoded state values above, the 32 possible five-bit values map into the nine states shown in FIG. 9 and an "unused" state as:

| | |
|---|---|
| X: | 00000 |
| X'/X": | 00001, 00010, 00100, 01000, 10000 |
| Y: | 11100 |
| Y'/Y": | 11101, 11110, 11000, 10100, 01100 |
| Z: | 00111 |
| Z'/Z": | 00110, 00101, 00011, 01111, 10111 |
| Unused: | 01001, 01010, 01011, 01101, 01110, 10001, 10010, 10011, 10101, 10110, 11001, 11010, 11011, 11111 |

Note that value '00100' of single error states X'/X" is equally close to single-error states Y'/Y" and Z'/Z".

As can be seen from FIG. 9, and also from the example encoding above, choosing values for the encoded states that are three bits apart from each other ensures that all the single error states are distinct, and that single-error correction is possible. The presence of the unused state and its values in this example indicates that there are some values that are two or more bits distant from any of the un-errored encoded state values; this in turn implies that some, though not necessarily all, double-bit errors can be detected.

For example, the value '01001' in the unused state is clearly two bits away from any of state X, state Y, or state Z, and thus cannot be mistaken for a single-bit error in any of the encoded values of these states. If the encoded value was initially that of one of the defined states X, Y, or Z, and if the value '01001' was subsequently observed as the encoded value, it could only have arrived due to an error more severe than a single-bit error.

EDAC as used for TCAMs can take advantage of the ternary encoding and use codes specially designed for TCAMs, denoted herein as TCAM Error-Correcting (TEC) Codes. TEC codes do not have to provide all possible binary values of the un-encoded state since the ternary nature of TCAMs does not use all possible encodings. For example, a single-error-correcting TEC code for one bit position of a TCAM need only support three distinct values that have a minimum distance of three from each other. The three values may be chosen in any fashion that provides the required minimum distance.

Often, such values may be found by writing a computer program to search for values with the required properties. One such set of three values requires five bits: '00000', '01011', and '11100'; these values could be used to encode the states "0", "1", and "don't care" respectively. TEC codes can be chosen to have properties such as ease of decoding, minimization of logic, or minimization of power. Since a limited number, and importantly a non-power-of-two number, of values are being encoded, TEC codes have an ability to be optimized for factors other than minimum distance.

Providing a larger minimum distance, and thus providing more error correction and/or detection "power" may require more bits in the encoded value. An example of three values that have a minimum distance of four from each other and can provide single-error correction and double-error detection is the three, six-bit values: '001000', '010101', and '110010'.

TEC codes can provide even lower storage overhead when a state encoding is used to combine multiple bit positions of state. For example, two ternary bit positions have nine possible values between them. Hence, a TEC code to provide single-bit error correction for two bit positions needs to have nine possible values that have a minimum distance of three. The following nine, eight-bit hexadecimal values are such a code: 0x00, 0xe0, 0x38, 0x0e, 0x83, 0x6d, 0x5b, 0xd6, 0xff. To use this encoding, an association must be made between the values, and the desired states of the two bits being encoded. For example, the value 0x00 could represent the state where both ternary bit positions have the state "0", and the value 0xff could represent the state where both ternary bit positions have the state "don't care". The specific assignment of values to states can also be chosen to optimize one or more parameters of a particular implementation.

Extending the previous example further, a TEC code to provide single-bit error correction and double-bit error detection for two bit positions does not require any additional bits compared to the previous example. The following nine, eight-bit hexadecimal values with a minimum distance of four are such a code: 0x00, 0x0f, 0xf0, 0xff, 0x33, 0xcc, 0xaa, 0x55, 0x66. This example illustrates that TEC codes may be more efficient than other codes.

Of course, the state encoding can be extended further, some trade-offs being the complexity of decoding the code, and the complexity of interpreting the larger amount of state. Three ternary bit positions have 27 possible values, and thus a TEC code for single-error correction of three ternary bit positions would require 27 values with a minimum distance of three.

TEC codes may also be chosen for stronger error correction, such as double-error correction, requiring a minimum distance of five. One example of a double-error correcting TEC code for one bit position is given by the three, eight-bit hexadecimal values: 0xff, 0xa1, and 0x58. Extending this one step further, double-error correction and triple-error detection requires a minimum distance of six; one example of such a TEC code for one bit position is given by the three, nine-bit octal values: 000, 770, and 077.

The values selected for a TEC code can be optimized to provide ease of implementation, including minimizing a number of bits in each value necessary to provide a required minimum distance, minimizing logical complexity of decoding the code or error-correction comparison logic to perform error detection and/or correction, and minimizing logical complexity of using the state. Factors influencing the selection of values include the logic family and/or technology being used for the implementation, physical implementation properties and constraints of the implementation, and timing issues.

The error-correction power of a code can be chosen based on factors such as technology, type of packaging to be used, ambient environment to be used, and system-level constraints. The ambient environment includes factors such as altitude (affecting, for example, the frequency of arrival of cosmic neutrons that might cause errors), and temperature (affecting susceptibility to errors). The system-level constraints include factors such as an application for the CAM/TCAM and a desired degree of reliability of the application, and whether the system can support real-time requirements, such as scrubbing. For example, if the expected error rate given the technology, packaging, and ambient environment is low, and the technology is not one that might incur double-bit errors from a single-event upset, then perhaps single-error correction, combined with background scrubbing to avoid double-bit errors, is sufficient to achieve desired reliability requirements.

While the description above has been specific to TCAMs, specifically to a ternary encoding of values in each bit position, the concepts described are applicable to any encoding in which not all values in the state space are used. Future types of CAMs may offer other, non-binary or non-ternary state encodings, and EDAC for such CAMs may be constructed using the techniques described herein.

Encoding

In some embodiments, write data received via input circuitry to a CAM or a TCAM is EDAC-encoded so that the values stored in entries of the CAM/TCAM are protected from a number of errors up to a correctable threshold. In some implementations where entry groups contain just one bit position of an entry of the CAM/TCAM, encoding is done via a table lookup. For example, in a TCAM with a mask value and a data value pair being written to each entry, each entry group needs to be provided with an encoded mask/data pair of bits. An encoder implementing such an encoding can use a simple table lookup of the mask/data pair of bits to provide an encoded value to be written to the corresponding entry group. Continuing the example, the three values "0" (entered as the mask/data pair '0/0'), "1" (entered as the mask/data pair '0/1'), and "don't care" (entered as the mask/data pair '1/x') could be encoded with a single-error correcting TEC code as:

0/0=>00011
0/1=>01000
1/x=>10100

In some implementations, the equivalent of a table lookup is done via logic gates which convert a mask/data pair into an encoded form. Using the example table look-up above, if the mask/data pair is labeled M/D respectively, and the five bits in the encoded value are labeled from left to right as B4, B3, B2, B1, and B0, then:

B4=M
B3=!M && D
B2=M
B1=!M && !D
B0=!M && !D

In a similar manner, entry groups which encode multiple bit positions can be encoded using a larger table look-up, or corresponding logic gates implementing the equivalent function as the table look-up. For example, the nine values possible in two bit positions of a TCAM can be encoded via a table lookup with a single-error correcting, double-error detecting TEC code as:

0/0, 0/0=>0x00
0/0, 0/1=>0x0f
0/1, 0/0=>0xf0
0/1, 0/1=>0xff
0/0, 1/x=>0x33
0/1, 1/x=>0x66
1/x, 0/0=>0xaa
1/x, 0/1=>0x55
1/x, 1/x=>0xcc In a similar manner to the one bit position example given above, this table for two bit positions can be implemented in equivalent logic gates. Conversion of a table to logic gates can be done via techniques such as Karnaugh maps or logic synthesis.

Decoding

In some embodiments, EDAC-encoded state for CAMs and TCAMs, including TEC-encoded state as described above, is decoded to produce match controls, and the match controls are then used to effect or otherwise control a comparison between a stored value represented in the encoded state and an input value. For example, the following single-error correcting TEC code has three, five-bit values representing the states "0", "1", and "don't care" respectively: '11000', '11111', and '00101'. In some implementations, the encoded, five-bit state is decoded into a separate mask value (representing the "don't care" state), and a data value (representing the desired data value when not in the "don't care" state). If the five bits in the five-bit encoding of the example are labeled from left to right as B4, B3, B2, B1, and B0, then the mask value and data value can be decoded (correcting any single-bit error in the process) from the encoded state via the equations:

mask=![(B4 && B3)||((B4||B3) && (!B2||B1))]

data=(B2 && B1)||(B2 && B0)||(B1 && B0)

In some implementations, the mask and data values as computed above are used as part of a comparison with an input value to produce an active-low signal used to discharge a pre-charged "hit" line if there is no match:

discharge*=mask||!(input^data)

By having each bit position of the comparison separately enabled to discharge a pre-charged hit line, a comparison across multiple bits can be implemented as a combination of individual comparisons in each bit position. In various implementations, state other than a mask value and a data value may be encoded, the comparison may be implemented in different ways, and a result of a comparison in each bit position may be combined using techniques other than a pre-charged "hit" line.

In some embodiments, EDAC-encoded state for CAMs and TCAMs, including TEC-encoded state as described above, is operated upon directly along with the input value, such as by an error-correcting comparison, to produce an active-low signal used to discharge a pre-charged "hit" line if there is no match. For example, the following single-error correcting TEC code has three, five-bit values representing the states "0", "1", and "don't care" respectively: '00000', '01011', and '11100'. If the five bits in the five-bit encoding are labeled from left to right as B4, B3, B2, B1, and B0, and if the data input being compared is labeled as D, then producing an active-low signal used to discharge a pre-charged "hit" line if there is no match, and doing so correctly despite any single-bit error in the encoded state, can be implemented as:

discharge* =
  ![ ((D ^ B3) && !B2 && (B1 ^ B0)) ||
     (D && (!B4 || !B3) && !B2 && !B1 && !B0) ||
     (!D && B1 && B0) ||
     (D && !B4 && !B3 && B2) ]

In some implementations, it is less expensive in factors such as area or power to directly operate upon the EDAC-encoded state, such as by an error-correcting comparison, rather than separately decoding and then operating upon decoded results. In various implementations, the operation may be implemented in different ways, and the results of the operation in each bit position may be combined using techniques other than a pre-charged "hit" line.

The techniques provided above are extendable to other codes. Given knowledge of the code, an implementation of either decoding, or of an error-correcting comparison, can be accomplished with methods such as Karnaugh maps or logic synthesis.

System

Figure 4:
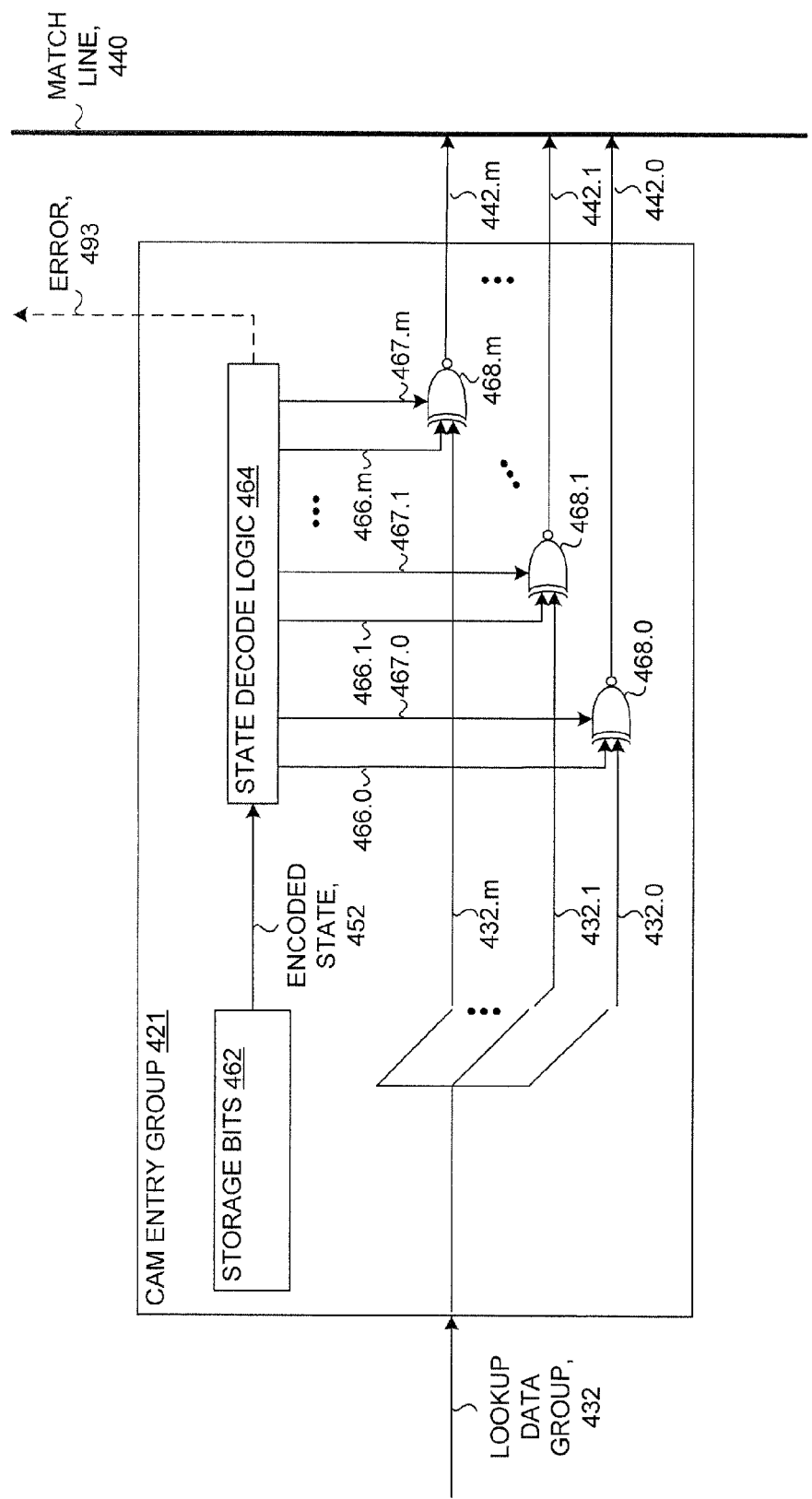
FIG. 4 illustrates an embodiment of a content addressable memory entry group that uses storage bits to obtain error-corrected match controls.

FIG. 1 illustrates a content addressable memory entry with multiple entry groups, the entry groups similar to those shown in FIG. 4. Content addressable memory entry 110 is comprised of entry groups 121.1, 121.2, . . . , 122.j, . . . up to a number of entry groups sufficient for the width of the entry. In some embodiments, each entry group corresponds to one bit position of the entry. In other embodiments, each entry group corresponds to multiple bit positions of the entry. Each entry group is coupled to a corresponding portion of the lookup data, shown as lookup data groups 131.1, 131.2, . . . , 131.j, . . . up to a number of lookup data groups sufficient for the width of the lookup data. In some implementations, the lookup data and the entry have the same width. In some implementations, the lookup data is a multiple of the width of the entry, and multiple entries are ganged together to perform a lookup. Each entry group compares its corresponding lookup data group with a stored state and generates a respective portion compare result, shown as partial hit indications 141.1, 141.2, . . . , 141.j, . . . up to the maximum number of entry groups.

Entry group 121.j is representative of the other entry groups; it comprises storage bits 162 holding the stored, encoded state to be compared with the corresponding lookup data group, decode logic 164, and compare logic 168. Decode logic 164 is coupled to compare logic 168 via match controls 166. Compare logic 168 generates partial hit indication 141.j, using match controls 166 to control the comparison.

Continuing in FIG. 1, entry 110 further comprises precharge logic 199, used to precharge match line 140. Any of the partial hit indications, such as 141.1, 141.2, or 141.j, may discharge the precharged match line, and thus indicate a non-matching condition. Accordingly, a mismatch detected in any entry group causes the entire entry to report a mismatch. Precharge logic 199 may utilize a clock or other control means (not illustrated) to control its operation, such as to determine when to precharge match line 140. Similarly, partial hit indications such as 141.1, 141.2, or 141.j may use similar control means to synchronize when a lookup is enabled, and to only discharge match line 140 at a proper time.

Match line 140 is used to generate a hit indication for entry 110, shown as hit 149. The hit indication may be coupled to the match line in a number of ways, such as by an output buffer or driver, or by means of other control logic. In some implementations, the hit indication is latched, either inside entry 110 or external to it, to enable pipelining of lookup operations.

Figure 2:
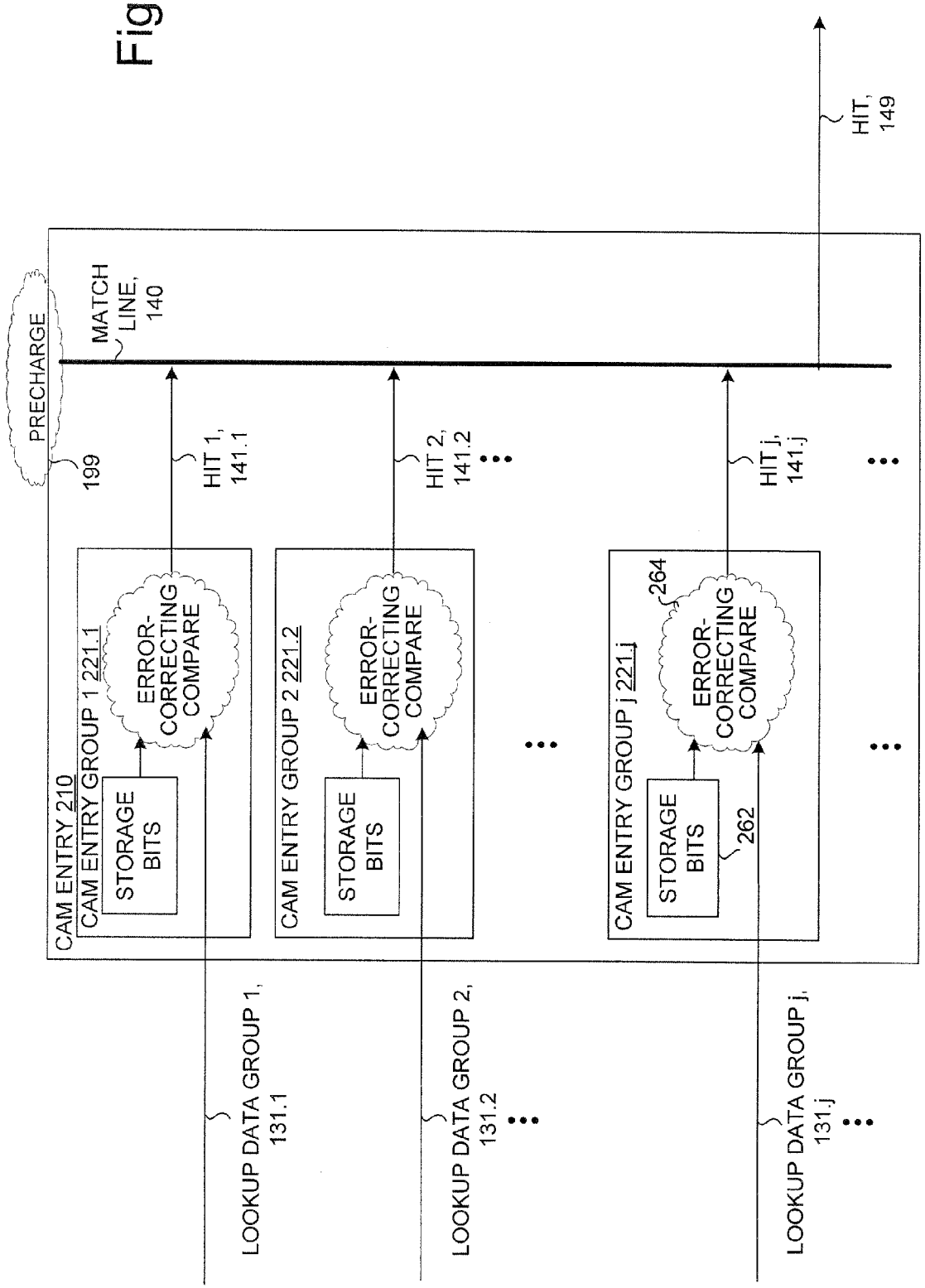
FIG. 2 illustrates a content addressable memory entry with multiple entry groups, the entry groups similar to those shown in FIG. 5.
Figure 5:
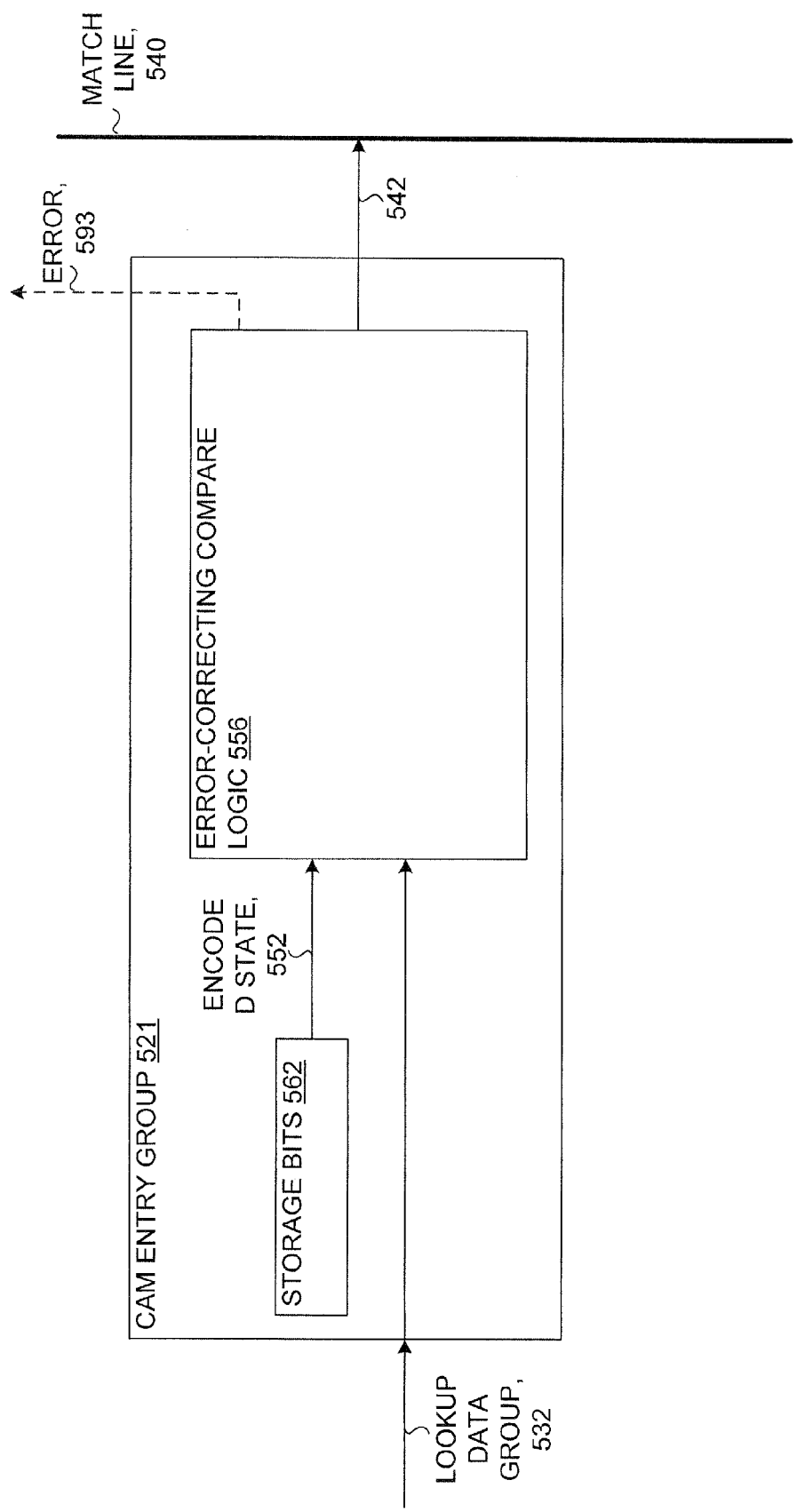
FIG. 5 illustrates an embodiment of a content addressable memory entry group that combines storage bits with lookup data to effect an error-correcting comparison.

FIG. 2 illustrates a content addressable memory entry with multiple entry groups, the entry groups similar to those shown in FIG. 5. Content addressable memory entry 210 is comprised of entry groups 221.1, 221.2, . . . , 222.j, . . . up to a number of entry groups sufficient for the width of the entry. In some embodiments, each entry group corresponds to one bit position of the entry. In other embodiments, each entry group corresponds to multiple bit positions of the entry. Each entry group is coupled to a corresponding portion of the lookup data, shown as lookup data groups 131.1, 131.2, . . . , 131.j, . . . up to a number of lookup data groups sufficient for the width of the lookup data. In some implementations, the lookup data and the entry have the same width. In some implementations, the lookup data is a multiple of the width of the data, and multiple entries are ganged together to perform a lookup. Each entry group compares its corresponding lookup data group with stored state and generates a respective portion compare result, shown as partial hit indications 141.1, 141.2, ..., 141.j, ... up to the maximum number of entry groups.

Entry group 222.j is representative of the other entry groups; it comprises storage bits 262 holding the stored, encoded state to be compared with the corresponding lookup data group, and error-correcting compare logic 264. Error-correcting compare logic 264 operates upon the stored state 262 and the corresponding lookup data group 131.j and directly generates partial hit indication 141.j.

Continuing in FIG. 2, entry 210 further comprises precharge logic 199, used to precharge match line 140. Any of the partial hit indications, such as 141.1, 141.2, or 141.j, may discharge the precharged match line, and thus indicate a non-matching condition. Accordingly, a mismatch detected in any entry group causes the entire entry to report a mismatch. Precharge logic 199 may utilize a clock or other control means (not illustrated) to control its operation, such as to determine when to precharge match line 140. Similarly, partial hit indications such as 141.1, 141.2, or 141.j may use similar control means to synchronize when a lookup is enabled, and to only discharge match line 140 at a proper time.

Match line 140 is used to generate a hit indication for entry 210, shown as hit 149. The hit indication may be coupled to the match line in a number of ways, such as by an output buffer or driver, or by means of other control logic. In some implementations, the hit indication is latched, either inside entry 210 or external to it, to enable pipelining of lookup operations.

Figure 3:
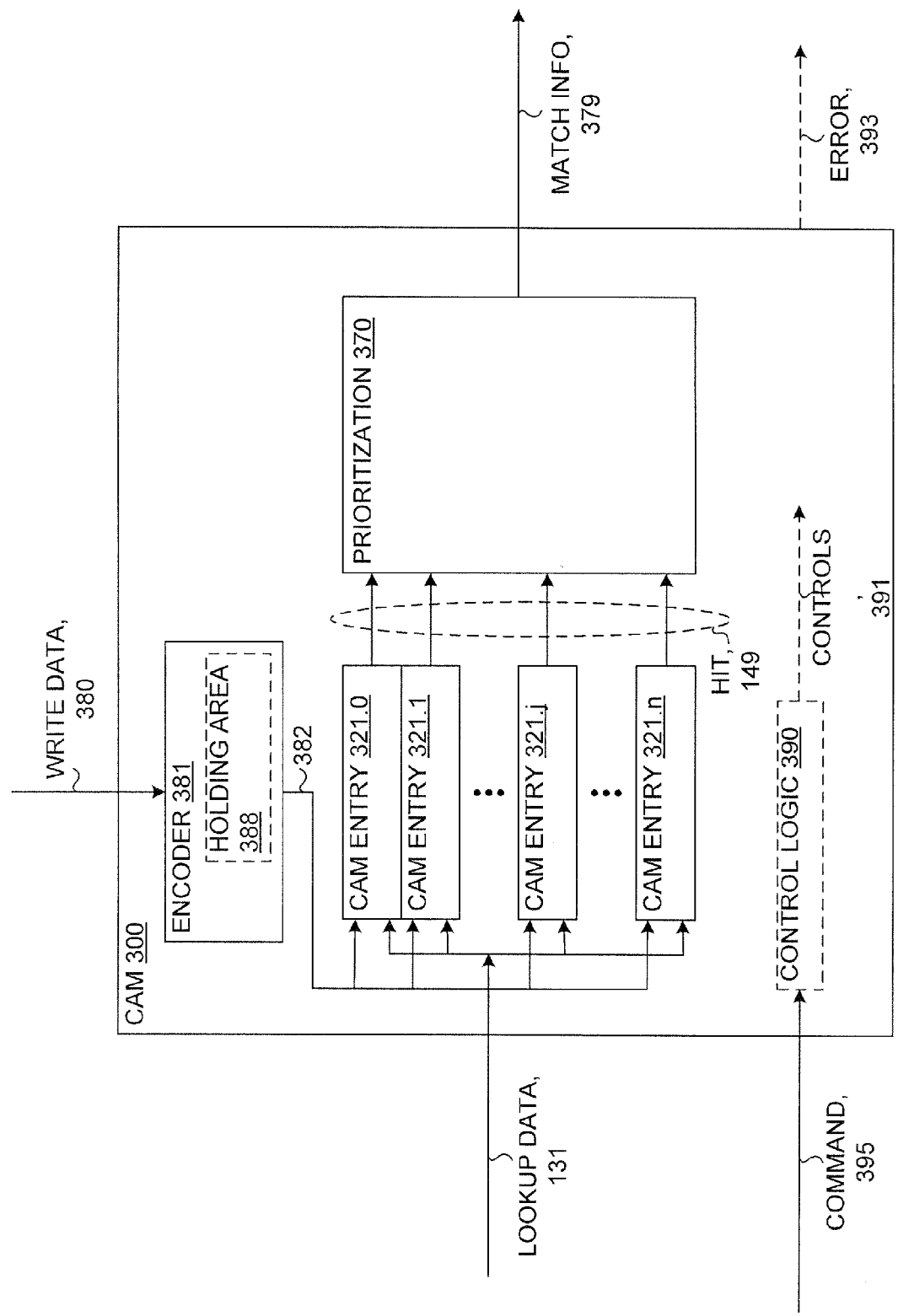
FIG. 3 illustrates an embodiment of a content addressable memory that generates encoded write data for storage in entries.

FIG. 3 illustrates an embodiment of a content addressable memory that generates encoded write data for storage in entries. CAM 300, which may be a CAM or a TCAM, comprises a plurality of entries shown as 321.0, 321.1, ..., 321.j, ..., up to a final entry 321.n. In some implementations, the entries 321 are similar to the ones shown in FIG. 1 and/or in FIG. 2. Each entry produces a hit indication, shown as hit indications 149. Prioritization logic 370 is coupled to the hit indications, and produces match info 379, which is an output of CAM 300. In some embodiments, prioritization logic 370 utilizes a priority encoder to generate the index of a first matching entry. In some implementations, prioritization logic 370 includes multiple levels of priority encoding, such as in preferring a hit in a higher-numbered bank of entries over a hit in a lower-numbered bank of entries, irrespective of the indices of one or more hit entries within each bank.

Continuing in FIG. 3, control logic 390 generates controls 391, using a combination of internal state, such as from control/state registers, and externally-provided information such as command 395. In some embodiments, command 395 includes a command type field indicating an operation to be performed by CAM 300. In some implementations, command 395 includes one or more mode bits controlling the operating mode or other features of CAM 300. Controls 391 may be used in various portions of CAM 300 for purposes such as controlling or sequencing of individual operations (for example, lookups, reads, or writes), controlling operating modes, enabling features, or controlling error detection, error correction, and/or error reporting. In some implementations, an error output 393 provides, under control of control logic 390, reporting of errors detected during operations such as lookups or reads. For example, in some usage scenarios, a correctable or uncorrectable error in encoded state stored in an entry is reported on error output 393, if enabled by control logic 390.

Further in FIG. 3, lookup data 131 is an input to CAM 300. In some embodiments, the lookup data is provided to each entry in order to search the entries to find one (or more) that match the lookup data. In some implementations, lookup data 131 is segregated into a plurality of lookup data groups, each lookup data group coupled to a corresponding entry group of each entry. Write data 380 is an input to CAM 300. In various embodiments, lookup data 131 and write data 380 are both received by the same input circuitry, with a separately-received command 395 used to control the type of operation, such as a lookup or a write, to be performed by CAM 300.

Write data 380 is coupled to encoder 381, producing encoded write data 382. In some embodiments, encoder 381 implements encoding of an error detection and correction code. In some implementations, the error detection and correction code is a TCAM Error-Correcting (TEC) code, as described above in the section "Choice of Codes". Encoded write data 382 is provided to the entries, and is used to modify state stored in selected entries. In some embodiments, the encoded write data is segregated into groups in the same manner as the entries are segregated into entry groups, and the encoding done by encoder 381 is likewise segregated so that the data written to each entry group is encoded independently of the data written to any other entry group. In various embodiments, write data for an entry may be received in separate commands, such as a mask value in one command and a data value in another command. In some implementations, encoder 381 includes a holding area 388 where one of the mask value or the data value is held, pending the arrival of the other, so that both the mask value and data value can be encoded together. In various embodiments, the holding area is contained elsewhere in CAM 300, and is coupled to encoder 381.

FIG. 4 illustrates an embodiment of a content addressable memory entry group that uses storage bits to obtain error-corrected match controls. CAM entry group 421, which may be an entry group for a CAM or a TCAM, implements m+1 bit positions of a CAM entry. CAM entry group 421 receives lookup data group 432 as an input. In some implementations, the lookup data group has the same number of bit positions as the CAM entry group. As shown, lookup data group 432 is comprised of individual bits of lookup data 432.0, 432.1, ..., 432.m. The lookup data group is compared, via other logic to be described, with a comparison value stored in encoded form in storage bits 462 to produce one or more partial hit indications 442.0, 442.1, ..., 442.m. In some implementations, the partial hit indications are used to discharge match line 440, such that any partial hit indication not indicating a hit will cause the match line to discharge. In various embodiments, the partial hit indications may be combined in other ways, either within a CAM entry group, or among CAM entry groups.

Continuing in FIG. 4, storage bits 462 hold encoded state 452, which is decoded by state decode logic 464, producing a set of match controls: data bits 466.0, 466.1, ..., 466.m, and mask bits 467.0, 467.1, ..., 467.m. The match controls are used to control a comparison via enabled XOR gates 468.0, 468.1, ..., 468.m, such that any data bit 466 which disagrees with a corresponding bit of lookup data 432 and which is not masked by a corresponding mask bit 467 causes the corresponding partial hit indication 442 to be in a state that will discharge match line 440. State decode logic 464 is designed, and the encoding of encoded state 452 is chosen, such that any errors in the encoded state, up to a correctable limit, do not affect the correctness of partial hit indications 442.

In some embodiments, state decode logic 464 produces an error output 493 that indicates a type of error encountered in the storage bits, such as a single-bit error or an uncorrectable error. Error outputs 493 from among multiple entry groups may be accumulated at higher levels of a CAM, such as CAM 300 in FIG. 3, and may be used, at least in part, to generate a CAM-level error indication or a CAM-level error output, such as error output 393 in FIG. 3.

FIG. 5 illustrates an embodiment of a content addressable memory entry group that combines storage bits with lookup data to effect an error-correcting comparison. CAM entry group 521, which may be an entry group for a CAM or a TCAM, implements m+1 bit positions of a CAM entry. CAM entry group 521 receives lookup data group 532 as an input. In some implementations, the lookup data group has the same number of bit positions as the CAM entry group. Storage bits 562 hold a comparison value in an encoded form, provided as encoded state 552 and coupled thereby to error-correcting compare logic 556. Lookup data group 532 is compared, via error-correcting compare logic 556, with the comparison value to produce partial hit indication 542. Error-correcting compare logic 556 is designed, and the encoding of encoded state 552 is chosen, such that any errors in the encoded state, up to a correctable limit, do not affect the correctness of partial hit indication 542. In some implementations, the partial hit indication is used to discharge match line 540, such that the partial hit indication not indicating a hit will cause the match line to discharge.

In various embodiments, partial hit indications among multiple CAM entry groups may be combined in ways other than by use of a match line. In some embodiments, error-correcting compare logic 556 produces an error output 593 that indicates a type of error encountered in the storage bits, such as a single-bit error or an uncorrectable error. Error outputs 593 from among multiple entry groups may be accumulated at higher levels of a CAM, such as CAM 300 in FIG. 3, and may be used, at least in part, to generate a CAM-level error indication or a CAM-level error output, such as error output 393 in FIG. 3.

Figure 6:
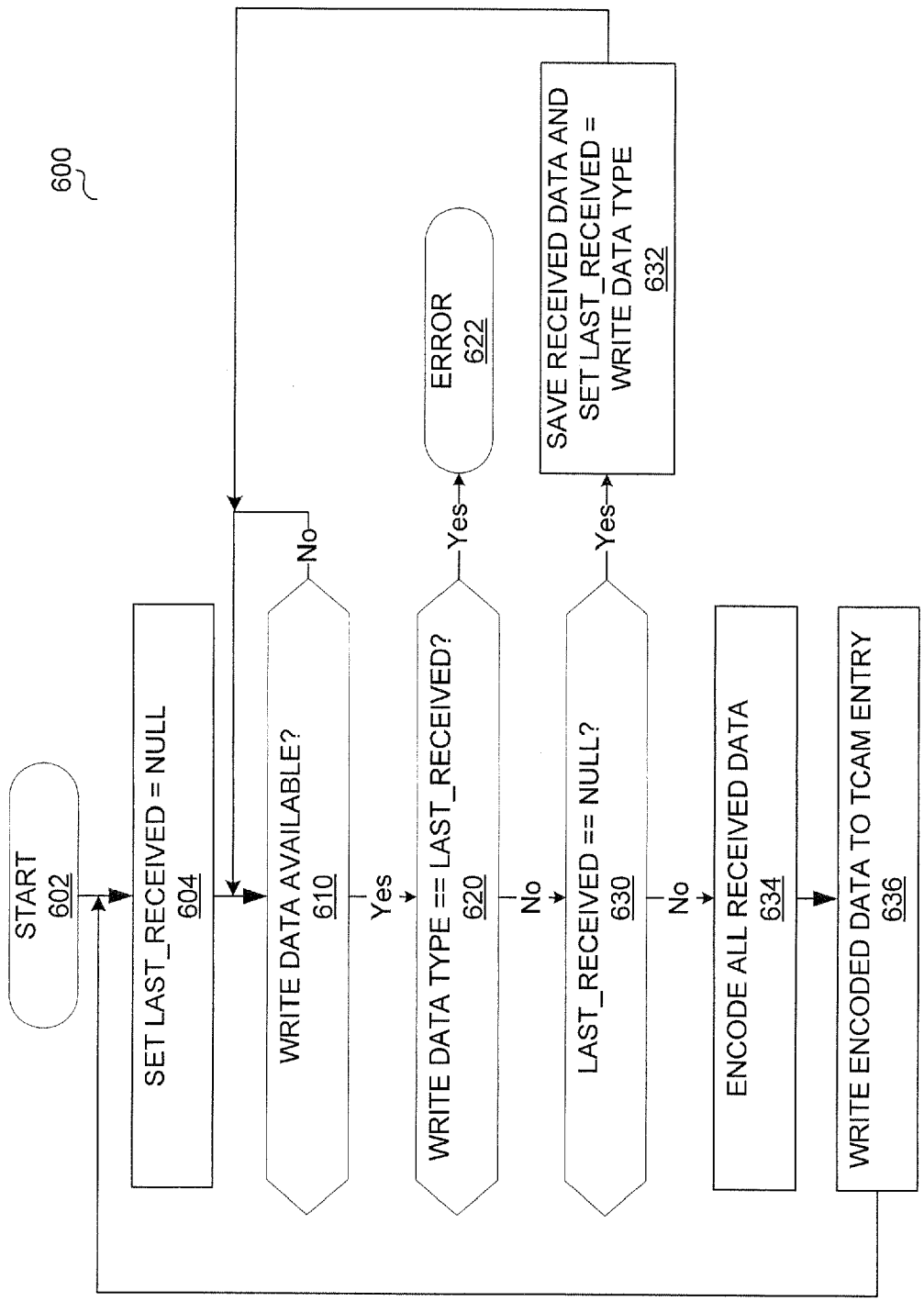
FIG. 6 illustrates how error detection and correction encoding can be performed when writing data to a ternary content addressable memory.

FIG. 6 illustrates how error detection and correction encoding can be performed when writing data to a ternary content addressable memory. In some implementations, write data to an entry of a TCAM is provided via separate writes of a mask value and a data value. In some implementations, the mask value and data value to be stored in an entry are encoded together by an error detection and correction code, and hence encoding cannot complete, and the entry cannot be completely written, until both the mask value and data value are provided. Process 600 shown in FIG. 6 handles such an implementation.

Process 600 commences in initial block 602, and proceeds to block 604 where a state variable, last_received, indicating the type of a last received write data input is set to NULL. Processing continues to block 610, and stays in block 610 until a write operation is received and write data is available. When write data is available, processing continues with block 620.

Block 620 compares the last_received state variable with the type of write data (such as a mask value type or a data value type) received. If the type of data received is the same as the type last received, processing continues to block 622 and reports an error; otherwise, processing continues to block 630. In some implementations, instead of or in addition to reporting an error via block 622, processing continues to block 632 and allows new write data of the same type as the last received to replace the last received write data.

Block 630 checks to see if the last_received state variable is NULL, indicating that this is the first of a pair of writes. If the state variable is NULL, processing continues to block 632 where the write data is saved, such as in holding area 388 in FIG. 3, and where the last_received state variable is set to indicate the type of the write data (such as a mask value type or a data value type) that was received. Processing then continues with block 610 to await a subsequent write operation.

In block 630, if the last_received state variable is not NULL, indicating that this is the second of a pair of writes, processing continues to block 634. Block 634 encodes all the write data, both the newly received write data and the saved write data from the prior write operation. In some implementations, the encoding is done by an encoder such as encoder 381 in FIG. 3. Processing then continues with block 636, where the encoded data is written to one or more selected TCAM entries. Processing then returns to block 610 to await a subsequent write operation.

Figure 7:
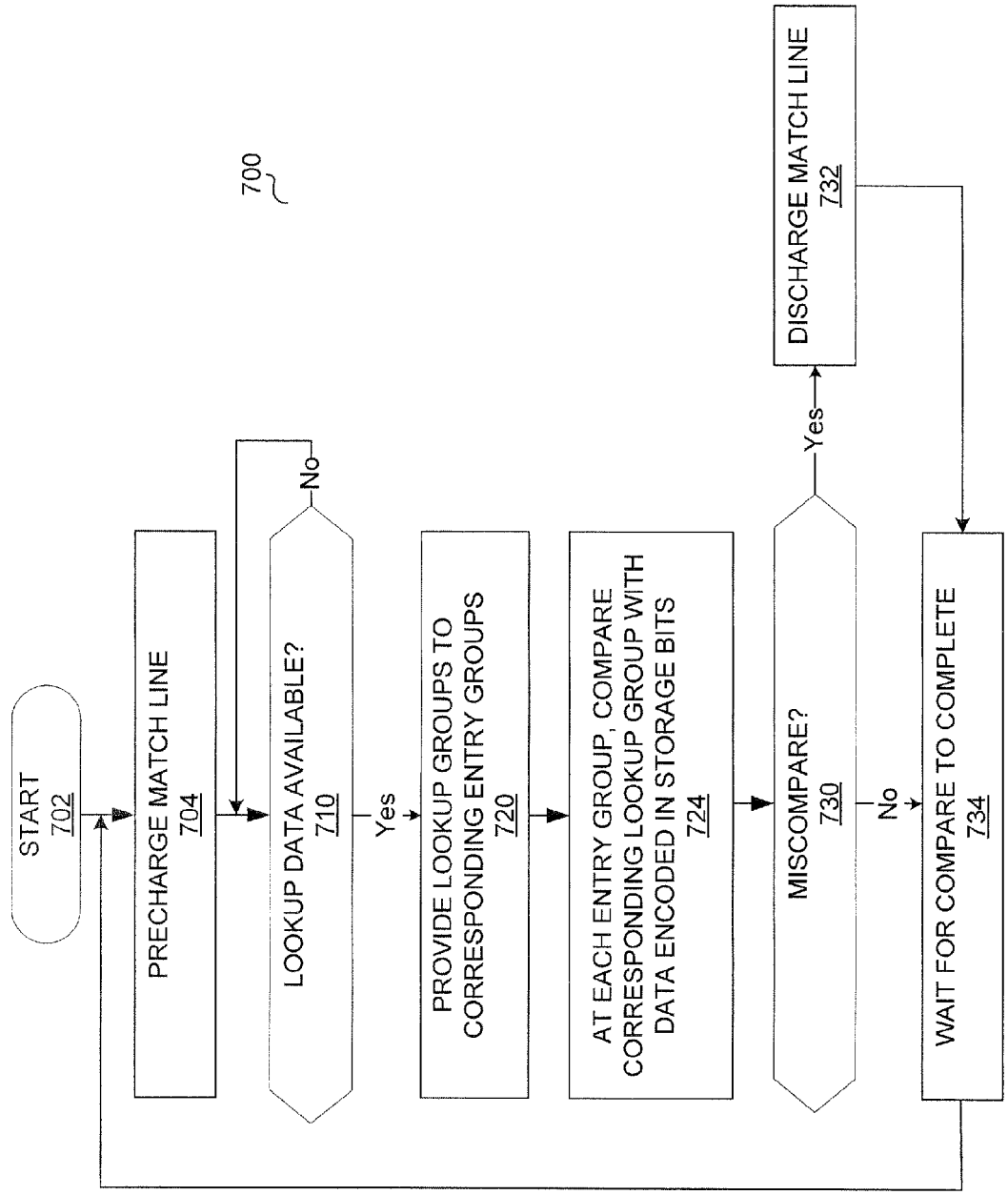
FIG. 7 shows how error detection and correction can be performed when searching for data in a content addressable memory.

FIG. 7 shows how error detection and correction can be performed when searching for data in a content addressable memory, such as CAM 300 shown in FIG. 3. In some embodiments, the entry being searched has a form similar to CAM entry 110 shown in FIG. 1. In some embodiments, the entry being searched has a form similar to CAM entry 210 shown in FIG. 2.

Process 700 commences in initial block 702, and proceeds to block 704 where a match line of the entry is precharged. Processing continues to block 710, awaiting the arrival of lookup data. When lookup data is available for a search of the entry, processing continues to block 720.

Block 720 ensures that the lookup data has been fanned out (provided) to all of the CAM entries of the CAM, and specifically that all of the lookup data groups of the lookup data have been provided to the corresponding entry groups of the entry being searched. In some implementations, block 720 entails a global wait for the lookup data to be distributed to all entries.

Processing continues with block 724, where the entry groups each independently compare the corresponding lookup data group with a comparison value stored in encoded form in storage bits of the entry group. In some embodiments, the comparison happens in a manner similar to that shown for CAM entry group 421 in FIG. 4. In some embodiments, the comparison happens in a manner similar to that shown for CAM entry group 521 in FIG. 5. In some implementations, a result of the comparison is a partial hit indication for the entry group.

Processing continues with block 730, where the result of the comparison is checked. If there was a miscompare, processing continues with block 732, where the match line is discharged. In some implementations, each entry group is capable of independently checking for a miscompare and discharging the match line. Whether the match line was discharged or not, processing continues with block 734.

Block 734 ensures that all the entry groups (of all the entries) have had sufficient time to complete a comparison and possible discharging of a match line, and that the match line has had time to fully discharge, if need be. In some implementations, block 734 entails a global wait for the completion of the comparison operations and possible discharging. In some embodiments, subsequent to block 734, the state of all the match lines (reported as the hit indications from each entry, such as hit indications 149 in FIG. 3) is latched. The latched hit indications are fed to prioritization logic, such as prioritization logic 370 in FIG. 3, and in parallel with the operation of the prioritization logic, the match lines can again be precharged.

Processing returns to block 704 to precharge the match line for a subsequent comparison.

CONCLUSION

The system described above can use dedicated processor systems, micro-controllers, programmable logic devices, or microprocessors that perform some or all of the operations. Some of the operations described above may be implemented in software and other operations may be implemented in hardware.

For the sake of convenience, the operations are described as various interconnected functional blocks or distinct software modules. This is not necessary, however, and there may be cases where these functional blocks or modules are equivalently aggregated into a single logic device, program or operation with unclear boundaries. In any event, the functional blocks and software modules can be implemented by themselves, or in combination with other operations in either hardware or software.

Having described and illustrated the principles of the invention in various embodiments thereof, it should be apparent that the invention may be modified in arrangement and detail without departing from such principles. Some of the details disclosed are not essential parts of an embodiment of the invention. Variations in the embodiments described may change or eliminate some features without altering or changing relationships among other features. The order or arrangement of steps in a process may be varied within the scope of the invention. Many other variations are possible, including differences in partitionings, encodings, sizes of fields, and ordering or numbering of bits. As the descriptions of the embodiments above cannot be exhaustive, features or concepts illustrated in one embodiment may be combined or inter-mixed with features or concepts illustrated in other embodiments. I claim all modifications and variation coming within the spirit and scope of the following claims.

The invention claimed is:

1. A content addressable memory comprising:
   lookup-data inputs receiving lookup data;
   a plurality of entries, each entry including a plurality of entry groups that each provide a contribution to an associated hit indication of the entry, each entry group having associated storage bits storing an encoded comparison value, wherein the encoded comparison value of a particular entry group of a particular entry is compared with a portion of the lookup data using an error-correcting comparison to produce the contribution of the particular entry group to the associated hit indication of the particular entry; and
   a match information output summarizing the hit indications from one or more of the entries.

2. The content addressable memory of claim 1, wherein the encoded comparison value of the particular entry group in the particular entry encodes at least three distinct values, each of the at least three distinct values separated from the others by a minimum distance.

3. The content addressable memory of claim 2, wherein the minimum distance is three.

4. The content addressable memory of claim 2, wherein the minimum distance is more than three.

5. The content addressable memory of claim 1,
   each entry group further comprising an uncorrectable error output; and
   wherein regardless of a single-bit error in the storage bits of a particular entry group of a particular entry, the contribution of the particular entry group to the hit indication of the particular entry is correct, and no error is signaled on the uncorrectable error output of the particular entry group; and
   wherein at least one error more severe than a single-bit error in the storage bits of the particular entry group is signaled on the uncorrectable error output of the particular entry group.

6. A content addressable memory comprising:
   lookup-data inputs receiving lookup data
   a plurality of entries, each entry including a plurality of entry groups that each provide a contribution to an associated hit indication of the entry, each entry group having associated storage bits storing an encoded comparison value, wherein the encoded comparison value of a particular entry group of a particular entry is decoded to produce match controls, the match controls being used to effect a comparison with a portion of the lookup data inputs to produce the contribution of the particular entry group to the associated hit indication of the particular entry; and
   a match information output summarizing the hit indications from one or more of the entries.

7. The content addressable memory of claim 6, wherein the match controls comprise a mask value and a data value for each bit of the lookup data.

8. The content addressable memory of claim 6, wherein regardless of a correctable error in the storage bits of a particular entry group of a particular entry, the contribution of the particular entry group to the associated hit indication of the particular entry is correct.

9. The content addressable memory of claim 8, wherein the correctable error is a single-bit error.

10. A content addressable memory comprising:
    lookup-data inputs receiving lookup data;
    write-data inputs receiving write data;
    a plurality of entries, each entry including a hit indication and a plurality of entry groups, each entry group including storage bits storing Error Detection And Correction (EDAC)-encoded comparison value information;
    a match information output summarizing the hit indications from at least some of the plurality of entries; and
    a data encoder encoding the write data to produce the EDAC-encoded comparison value information of each entry group.

11. The content addressable memory of claim 10,
    wherein the lookup data is segregated into a plurality of lookup groups of bits; and
    wherein each entry group of the plurality of entry groups of each entry is coupled to a corresponding lookup group.

12. The content addressable memory of claim 11,
    wherein each entry group of the plurality of entry groups of each entry further comprises decode logic to decode the EDAC-encoded comparison value information stored in the storage bits of the entry group to produce comparison value information; and
    wherein each entry group of the plurality of entry groups of each entry further comprises compare logic to compare a respective lookup group with the comparison value information.

13. The content addressable memory of claim 12, wherein results from the compare logic of all the entry groups of the plurality of entry groups of each entry are combined to produce the hit indication of each entry.

14. The content addressable memory of claim 11, wherein each entry group of the plurality of entry groups of each entry further comprises error-correcting compare logic to compare a respective lookup group with the EDAC-encoded comparison value information stored in the storage bits of the entry group.

15. The content addressable memory of claim 14, wherein results from the compare logic of all the entry groups of the plurality of entry groups of each entry are combined to produce the hit indication of each entry.

16. The content addressable memory of claim 10, wherein regardless of the presence of a correctable error in the storage bits of one or more of the plurality of entry groups of a particular entry, the hit indication of the particular entry is correct.

17. The content addressable memory of claim 16, wherein the correctable error is a single-bit error.

18. An entry of a content addressable memory comprising:
a plurality of storage bits holding a comparison value, the plurality of storage bits comprised of a plurality of groups of bits, each group of bits separately encoded;
a lookup input for entry-level comparison with the comparison value, the lookup input having a number of bits associated with each of the groups of bits;
a hit indication output indicating a hit when the lookup input corresponds with the comparison value, wherein the hit indication output is correct even when a correctable error is contained in the particular group of bits; and
logic associated with a particular group of bits to, at least in part, perform a group-level comparison between the bits of the lookup input associated with the particular group of bits and a portion of the comparison value held in an encoded form in the particular group of bits, the group-level comparison being a sub-portion of the entry-level comparison.

19. The entry of claim 18, wherein the correctable error is a single-bit error.

20. The entry of claim 18,
wherein the comparison value is a ternary comparison value; and
wherein the entry is one of plurality of entries of a ternary content addressable memory.

21. The entry of claim 18, wherein the comparison value is a binary comparison value.

22. An entry of a content addressable memory comprising:
comparison value information;
a lookup input for entry-level comparison with the comparison value information, the lookup input segregated into a plurality of lookup groups of bits;
a hit indication output indicating a hit when the lookup input compares properly with the comparison value information;
a plurality of entry groups, each entry group coupled to a corresponding lookup group, each entry group comprising a contribution to the hit indication output and a plurality of Error Detection And Correction (EDAC)-encoded storage bits, the storage bits among all entry groups holding the comparison value information of the entry; and
means for determining the contribution to the hit indication output of each entry group.

23. The entry of claim 22, wherein regardless of the presence of a correctable error in the storage bits of one or more entry groups, the hit indication output is correct.

24. The entry of claim 23, wherein the correctable error is a single-bit error.

25. The entry of claim 22, wherein the means for determining the contribution to the hit indication output of a particular entry group is based at least in part upon the storage bits of the particular entry group and the corresponding lookup group of the particular entry group.

26. A method for data lookup in a content addressable memory comprising:
comparing a lookup-data input against one or more entries of the content addressable memory and generating a hit indication of the compared entry when comparison value information maintained in the compared entry agrees with the lookup-data input;
summarizing the hit indications of each compared entry to produce a match indication output;
wherein the comparing against a particular entry is done in parts by multiple entry groups that each process a number of bits of the lookup-data input, each entry group storing an encoded portion of the comparison value information for the particular entry; and
wherein the encoded comparison value is compared with a portion of the lookup-data input using an error-correcting comparison to produce a contribution of a particular entry group to the hit indication for the compared entry.

27. The method of claim 26, wherein regardless of the presence of a correctable error in the encoded portion of the comparison value information stored in one or more entry groups of the particular entry, the comparing produces the correct hit indication of the particular entry.

28. The method of claim 27, wherein the correctable error is a single-bit error.

* * * * *